United States Patent
Edelmann

(10) Patent No.: US 6,690,578 B2
(45) Date of Patent: Feb. 10, 2004

(54) COOLING DEVICE

(75) Inventor: Achim Edelmann, Wilnsdorf-Wilden (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/182,344
(22) PCT Filed: Feb. 2, 2001
(86) PCT No.: PCT/EP01/01101
§ 371 (c)(1), (2), (4) Date: Nov. 25, 2002
(87) PCT Pub. No.: WO01/58231
PCT Pub. Date: Aug. 9, 2001

(65) Prior Publication Data
US 2003/0173059 A1 Sep. 18, 2003

(30) Foreign Application Priority Data
Feb. 2, 2000 (DE) .......................................... 100 04 474

(51) Int. Cl.$^7$ ................................................ H05K 7/20
(52) U.S. Cl. ....................... 361/699; 361/704; 361/719; 257/714; 257/718; 257/719; 174/15.1; 165/80.4; 165/46
(58) Field of Search ................................ 361/698, 399, 361/704, 719; 257/714, 718, 719; 174/15.1; 165/46, 80.3, 80.4

(56) References Cited

U.S. PATENT DOCUMENTS

| 3,586,102 | A | * | 6/1971 | Gilles ......................... 165/186 |
| 4,109,707 | A | | 8/1978 | Wilson et al. |
| 5,006,924 | A | * | 4/1991 | Frankeny et al. ........... 257/714 |
| 5,040,381 | A | * | 8/1991 | Hazen ......................... 62/3.2 |
| 5,245,508 | A | | 9/1993 | Mizzi |
| 5,306,866 | A | * | 4/1994 | Gruber et al. ............ 174/15.1 |
| 5,608,610 | A | * | 3/1997 | Brzezinski ................. 361/704 |
| 5,640,303 | A | * | 6/1997 | Hooley ....................... 361/699 |
| 5,887,435 | A | * | 3/1999 | Morton ......................... 62/3.6 |

FOREIGN PATENT DOCUMENTS

| DE | 19704549 A1 | * | 8/1997 | ............. C09K/5/00 |
| EP | 472269 A2 | * | 2/1992 | ............. H05K/7/20 |

* cited by examiner

Primary Examiner—Boris Chervinsky
(74) Attorney, Agent, or Firm—Pauley Petersen & Erickson

(57) ABSTRACT

A cooling device for cooling one or more electrical and/or electronic components, also referred to as E-components. The cooling device includes at least one cooling body which is assigned to the E-component and which is connected to the same in a thermoconductive manner. According to this invention, it is possible to achieve an effective heat exchange and thus a high operating efficiency in such a system. Thus, according to this invention the cooling body is in thermoconductive contact with a granular, liquid or pasty filling material that is capable of conducting heat. The liquid or pasty material is retained at least in areas by a flexible membrane, and the membrane is connected to a surface of the E-component.

6 Claims, 1 Drawing Sheet

COOLING DEVICE

BACKGROUND OF THE INVENTION

1. Field of the Invention

This invention relates to a cooling device for cooling one or more electrical components and/or electronic components (abbreviated below as E-components), with at least one cooling body, which is associated with the E-components and is connected to them in a thermoconductive manner.

2. Description of Related Art

Cooling devices of this kind are used as cooling bodies of Peltier elements. Their cooling side is brought into thermoconductive contact with the surface of the E-components. In order to be sure to achieve an effective heat dissipation, a surface contact that is as free as possible of air gaps is required. However, a wide variety of E-component surfaces and cooling body surfaces are currently in use so that an ideal transmission can only occur in specialized installations with adapted surface structures.

SUMMARY OF THE INVENTION

One object of this invention is to provide a cooling device of the type mentioned at the beginning in which an effective heat transmission between the E-components and cooling the body occurs at a low cost.

This object is achieved according to this invention by the cooling body being in thermoconductive contact with a granular, fluid, or paste-like thermoconductive filler material. The fluid or paste-like material is at least partially contained by a flexible membrane that is in surface contact with the E-components. The membrane nestles against the surface of the E-components to be cooled, producing an intimate surface contact. The filler material disposed behind the membrane follows the deformation of the membrane, thus producing the thermoconductive connection between the E-components and cooling body. The deformation of the membrane permits a heat exchange to effectively occur over a large surface area.

In one embodiment of this invention, the paste-like filler material is a gel, which has a high a heat storage capacity. In particular, the gel has a buffering capacity because of its heat storage capacity. The gel can be used to effectively cool E-components in which changing quantities of heat must be exchanged. In addition, the gel is a homogeneous mass, which easily compensates for deformations of the membrane and simultaneously assures a high rate of heat transmission.

According to this invention, the cooling devices can also be embodied as Peltier elements. In particular, the Peltier elements can be fastened to a mount or incorporated into it, for example encapsulated in it, and the mount can include a thermoconductive material. Thus the filler material can either contact the mount and the Peltier elements or, if the Peltier elements are completely encapsulated, can contact only the mount.

If the cooling device according to this invention operates inside a housing, for example inside a miniature electronics housing or in a switchgear cabinet, then a dissipation of heat from the cooling device must be provided. Thus it is possible to affix the mount to a housing and, with a heat exchanger side, contact the region encompassing the housing and/or contact a housing wall. The mount has a heat exchanger structure with cooling ribs near the heat exchanger side.

In order to allow the assembly of E-components and the membrane to be easily executed, in one embodiment of this invention the E-components are mounted on a printed circuit board, which is affixed in the housing by one or more supporting elements. At least one of the supporting elements is coupled to a guide by which the printed circuit board can be moved toward the fluid or paste-like material. Alternatively or in addition, it is possible that the fluid or paste-like material be held against a mount, and the mount can be moved toward each E-component by a guide.

BRIEF DESCRIPTION OF THE DRAWINGS

This invention is explained in detail below in view of an embodiment shown in the drawings, wherein.

DESCRIPTION OF PREFERRED EMBODIMENTS

Figure 1:
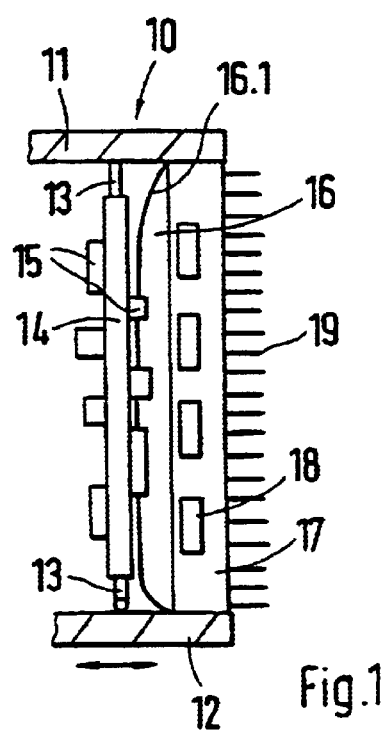
FIG. 1 is a schematic view of a housing with a cooling device in a sectional side view.

Th e drawings show a housing 10, which has a cover 11 and a bottom 12. A mount 17 forms a part of the side wall of the housing 10. The mount 17 is made of a cast aluminum.

On the outside, the mount 17 has protruding cooling ribs 19, which are disposed parallel to and spaced apart from one another. The cooling ribs 19 are of one piece with the mount 17. The mount 17 can also be made of a material other than aluminum. This material preferably has a high thermoconductivity. Four Peltier elements, which serve as cooling bodies 18, are encapsulated in the mount 17. Naturally, more or less than four Peltier elements can be used. The number of Peltier elements used depends on the quantity of heat to be dissipated.

On the side facing the interior of the housing 10, the mount 17 has a flat cooling surface. A membrane 16.1 stretches across the cooling surface in the shape of a pillow. A filler material 16, such as a paste-like gel, is held between the membrane 16.1 and the cooling surface of the mount 17. The membrane 16.1 is made of a flexible material, for example a plastic film. Preferably, both the membrane 16.1 and the filler material 16 have a favorable thermoconductivity.

Figure 2:
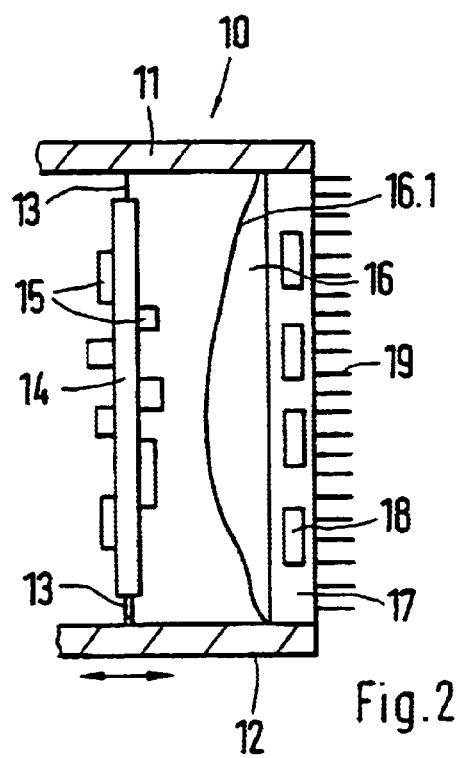
FIG. 2 shows the embodiment according to FIG. 1, but in a different mounting position.

A printed circuit board 14 is secured in the interior of the housing 10, spaced apart from the mount 17. The printed circuit board 14 can be a component. Correspondingly, the housing 10 is a component support. The printed circuit board 14 is respectively connected to the cover 11 and the bottom 12 by support elements 13. The connection is produced by guides, which permit the printed circuit board 14 to be shifted parallel to the plane of the drawing. The shifting direction is indicated in FIGS. 1 and 2 by a double arrow. Electronics and/or electronic components (E-components) 15 are mounted on both sides of the printed circuit board 14.

From the starting position shown in FIG. 2, the printed circuit board 14 is moved toward the mount 17 by the guides, until it reaches its installation position shown in FIG. 1. The printed circuit board 14 is locked in place in this installation position. During the transition into the installation position, the outside of the membrane 16.1 nestles against the surface of the E-components 15. This produces an intimate contact over a large area between the E-components 15 and the membrane 16.1.

During operation, the E-components 15 transmit their dissipated energy in the form of heat into the filler material 16 by the membrane 16.1. Because the filler material 16 has a favorable thermoconductivity, the heat is conveyed to the cooling bodies 18 through the mount 17. The warm side of the cooling body 18 facing the outside of the housing 10 then conducts the dissipated heat into the environment, which can occur in an effective manner by the cooling ribs 19.

What is claimed is:

1. In a cooling device for cooling one or more E-components which includes electrical components and/or electronic components, with at least one cooling body associated with the E-components and connected to the E-components in a thermoconductive manner, wherein the at least one cooling body (18) is in thermoconductive contact with one of a fluid and a paste thermoconductive filler material, one of the fluid and the paste material at least partially contained by a flexible membrane (16.1) in surface contact with the E-components, and wherein the E-components (15) are mounted on a printed circuit board (14) affixed in the housing (10) by at least one supporting element (13), the improvement comprising: the at least one cooling body (18) each embodied as a Peltier element which is one of fastened to a mount (17) and incorporated into the mount is of a thermoconductive material, and the at least one supporting element each coupled to a guide by which the printed circuit board (14) is moveable toward one of the fluid and the paste material (16).

2. In the cooling device according to claim 1, wherein the paste filler material (16) is a gel with a high heat storage capacity.

3. In the cooling device according to claim 2, wherein the mount (17) is affixed to a housing (10) and a heat exchanger side of the mount at least one of contacts a region surrounding the housing (10) and contacts a housing wall (10, 12), and the mount has a heat exchanger structure with cooling ribs (19) near the heat exchanger side.

4. In the cooling device according to claim 3, wherein one of the fluid and the paste material (16) is held against the mount (17), and the mount (17) is moveable toward the E-components by a guide.

5. In the cooling device according to claim 1, wherein the mount(17) is affixed to a housing (10) and a heat exchanger side of the mount at least one of contacts a region surrounding the housing (10) and contacts a housing wall (10, 12), and the mount has a heat exchanger structure with cooling ribs (19) near the heat exchanger side.

6. In the cooling device according to claim 1, wherein one of the fluid and the paste material (16) is held against the mount (17), and the mount (17) is moveable toward the E-components by a guide.

* * * * *